(12) United States Patent
Hisada et al.

(10) Patent No.: US 11,329,018 B2
(45) Date of Patent: May 10, 2022

(54) FORMING OF BUMP STRUCTURE

(71) Applicant: INTERNATIONAL BUSINESS MACHINES CORPORATION, Armonk, NY (US)

(72) Inventors: Takashi Hisada, Tokyo (JP); Toyohiro Aoki, Yokohama (JP); Eiji Nakamura, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 75 days.

(21) Appl. No.: 16/661,479

(22) Filed: Oct. 23, 2019

(65) Prior Publication Data

US 2021/0125950 A1 Apr. 29, 2021

(51) Int. Cl.
*H01L 23/00* (2006.01)

(52) U.S. Cl.
CPC ............. *H01L 24/11* (2013.01); *H01L 24/13* (2013.01); *H01L 24/14* (2013.01); *H01L 24/05* (2013.01); *H01L 2224/05124* (2013.01); *H01L 2224/11505* (2013.01); *H01L 2224/11616* (2013.01); *H01L 2224/13324* (2013.01); *H01L 2224/13347* (2013.01); *H01L 2224/13399* (2013.01)

(58) Field of Classification Search
CPC . H01L 24/11; H01L 24/13; H01L 2224/0508; H01L 2224/05082; H01L 2224/05083; H01L 2224/05084; H01L 2224/0558; H01L 2224/05582; H01L 2224/05583; H01L 2224/05584; H01L 2224/1308; H01L 2224/13082; H01L 2224/13083; H01L 2224/13084; H01L 2224/13298–13499; H01L 2224/11505; H01L 24/14; H01L 24/05; H01L 2224/05124
See application file for complete search history.

(56) References Cited

U.S. PATENT DOCUMENTS

| | | | |
|---|---|---|---|
| 6,992,001 B1 * | 1/2006 | Lin | ................... H01L 24/11 438/612 |
| 8,803,319 B2 * | 8/2014 | Kuo | ................. H01L 23/5329 257/757 |
| 9,455,183 B2 | 9/2016 | Hsiao et al. | |
| 9,859,241 B1 | 1/2018 | Aoki et al. | |
| 9,899,584 B2 | 2/2018 | Hwang | |
| 9,978,656 B2 | 5/2018 | Lin et al. | |
| 10,453,817 B1 | 10/2019 | Dadvand et al. | |
| 2016/0233187 A1 * | 8/2016 | Kim | ................. H01L 23/3114 |

(Continued)

OTHER PUBLICATIONS

International Search Report dated Dec. 30, 2020 for International Application No. PCT/IB2020/058823.

*Primary Examiner* — Michael M Trinh
(74) *Attorney, Agent, or Firm* — Tutunjian & Bitetto, P.C.; Randall Bluestone

(57) ABSTRACT

A technique for fabricating a bump structure is disclosed. A substrate that includes a set of pads formed on a surface thereof is prepared, in which the pads includes first conductive material. A metallic adhesion layer is coated on each pad. A bump base is formed on each pad by sintering conductive particles using a mold layer, in which the conductive particles includes second conductive material different from the first conductive material.

6 Claims, 13 Drawing Sheets

(56) References Cited

U.S. PATENT DOCUMENTS

| | | | |
|---|---|---|---|
| 2016/0268223 A1* | 9/2016 | Burgess | H01L 24/13 |
| 2018/0061797 A1 | 3/2018 | Aoki et al. | |
| 2018/0076163 A1* | 3/2018 | Aoki | H01L 24/14 |
| 2018/0374813 A1 | 12/2018 | Khazaka et al. | |
| 2019/0096832 A1 | 3/2019 | Tsao et al. | |
| 2019/0131260 A1* | 5/2019 | Kirby | H01L 24/05 |

* cited by examiner

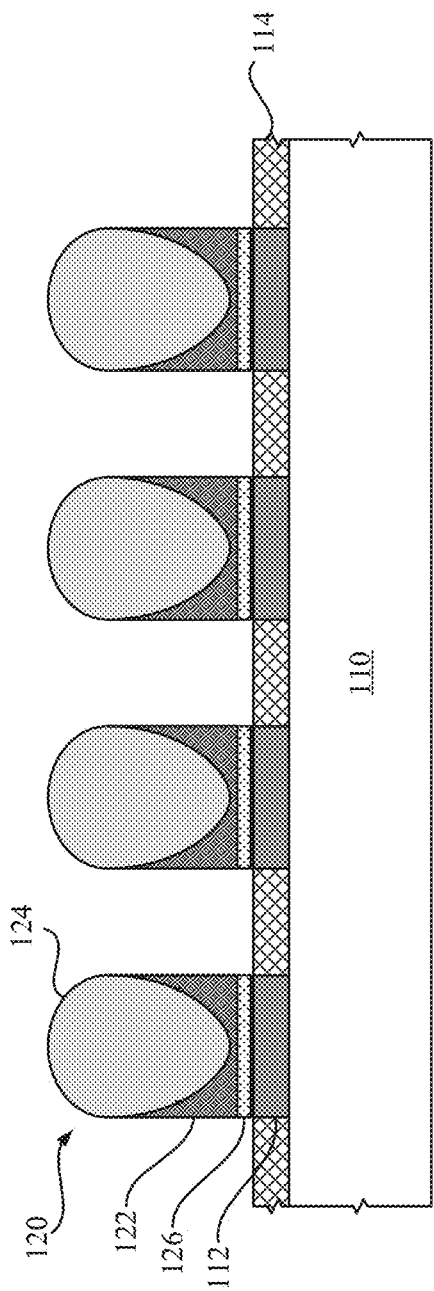
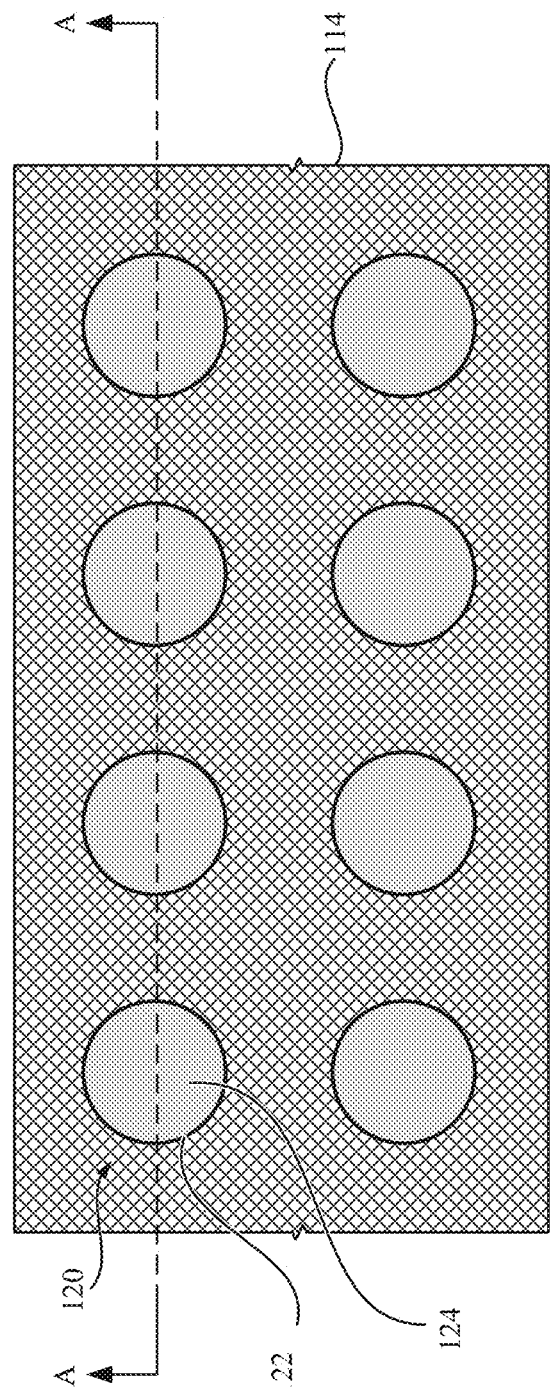
FIG. 1A
FIG. 1B

FORMING OF BUMP STRUCTURE

BACKGROUND

The present invention, generally, relates to bumping technology, more particularly, to a method of fabricating a bump structure, the bump structure, an electronic device including the bump structure and a method of manufacturing the electronic device.

The 3D and 2.5D chip packaging is technology that enables wideband signal transmission and short wiring length and it has attracted attention for improving the performance of computer systems in the future. As the bump pitch and the bump size in the 3D and 2.5D packaging become fine in comparison with conventional flip-chip packaging, reliability issues due to stress concentration at a solder joint and its interface and electro-migration due to high current density have arisen.

IMS (Injection Molded Solder) technology is a bumping technique in which solder bumps are formed on a substrate by injecting molten solder into openings in a resist mask directly. The IMS technology has an advantage of the flexibility of solder alloy composition, which leads to improvement on the mechanical characteristics and the resistance for the electro-migration, as well as fine pitch capability.

Recent trends in the high-density interconnect have led to the use of copper pillar (or post) bumps. However, an expensive copper plating process is required to fabricate a copper pillar underneath a solder cap. There is another technology capable of fabricating a pillar bump without the use of an expensive plating process, in which a pillar is fabricated by sintering conductive particles, which are typically provided as a paste form. The sintered pillar shows good reliability when the pillar is fabricated on a contact pad that is made of the same material, i.e. the sintered copper pillar is fabricated on a copper pad.

However, when conductive material that is different from the pillar, especially aluminum, is used as the contact pads, adhesion between the pillar and the contact pad is degraded even if the surface oxide of the aluminum pads is removed before the bump formation.

Therefore, there is a need for a novel bumping technique capable of fabricating a bump structure including a set of bumps formed on a substrate, in which the bumps made by sintering conductive particles are tightly bonded to pads made of conductive material different from the conductive particles.

SUMMARY

According to an embodiment of the present invention, a method of fabricating a bump structure is provided. The method includes preparing a substrate that includes a set of pads formed on a surface thereof, in which the pads include first conductive material. The method also includes coating a metallic adhesion layer on each pad. The method further includes forming a bump on each pad by sintering conductive particles using a mold layer, in which the conductive particles includes second conductive material different from the first conductive material.

The method according to the embodiment of the present invention enables fabrication of a bump structure including a set of bumps on a substrate, in which the bumps made by sintering the conductive particles are tightly bonded to pads of the substrate even if the pads are made of conductive material different from the conductive particles.

In a particular embodiment, the mold layer has a set of openings, each of which is aligned with one of the pads. The method includes, in forming the bump on each pad, disposing the mold layer on the substrate and filling conductive particles into the openings of the mold layer. The conductive particles filled in the openings of the mold layer are sintered to give a bump base on each pad. The method further includes filling solder material into the remaining space in each opening of the mold layer above the bump base to form a solder cap on each bump base.

In a preferable embodiment, the first conductive material includes Al and the second conductive material includes Cu. Since semiconductor devices typically use Al pads at the outermost layer, it is possible to fabricate the sintered bump base tightly bonded to the pads for practical use.

In one particular embodiment, the conductive particles are provided in a form of a paste. The bump base formed on each pad has a shape of a cup conforming to a contour of the opening of the mold layer and has a bottom bonded to the pad by the metallic adhesion layer. Thereby, it allows us to keep sufficient solder volume on the bump base even though the bump size becomes fine in comparison with a flat-topped pillar shape. Also, the bump base having the cup shape has an advantage in terms of the resistance for the electro-migration since the flow of current is dispersed in such shaped bump.

In a preferable embodiment, the method further includes applying a resist layer over the surface of the substrate. The method also includes patterning the resist layer to fabricate the mold layer. The method includes further depositing metallic adhesion material on the pads and the mold layer so as to conform to a contour of the mold layer and to provide the metallic adhesion layer coated on each pad. Since a removal process of a metallic layer underneath the resist layer after resist stripping is eliminated, undercut at the root of the bump is prevented.

In a preferable embodiment, the method includes, in filling the solder material, dissolving metallic adhesion material deposited on a top surface of the mold layer into solder material. Thereby, it allows a removal process of extra metallic adhesion material to be omitted while removing extra metallic adhesion material sufficiently. In this preferable embodiment, the metallic adhesion material may be selected from the group consisting of Cu, Ni, Au and any combination thereof. Cu, Ni and Au would be easily dissolved into the solder material such as molten solder during the filling process of the solder material.

In a preferred embodiment, the method further includes stripping the mold layer from the substrate so as to wash away the mold layer with metallic adhesion material on a top surface of the mold layer being lifted-off and washed together with the mold layer. Thereby, it allows a removal process of extra metallic adhesion material to be omitted regardless of the composition of the metallic adhesion material. Thus, it allows us to employ other functional material such as a Ti barrier as the metallic adhesion material even if the material is insolvable to the solder material such as molten solder. Also, the metallic adhesion material conforming to the contour of the mold layer would work as a sidewall barrier that prevents a short circuit between bumps due to ion migration.

In a preferred embodiment, the method includes further removing metallic adhesion material deposited on a top surface of the mold layer by a technique selected from the group consisting of chemical-mechanical polishing (CMP), mechanical polishing, fly-cutting and chemical etching. Although a removal process of extra metallic adhesion material is performed, however, the removal process of the metallic layer after the resist stripping, which would cause undercut at the root of the bump, is eliminated. It also allows us to employ other functional material such as a Ti barrier as the metallic adhesion material even if the material is insolvable to the solder material such as molten solder. Also, the metallic adhesion material conforming to the contour of the mold layer would work as a sidewall barrier that prevents a short circuit between bumps due to ion migration.

In a particular embodiment, the method further includes depositing metallic adhesion material over the surface of the substrate to have a first part corresponding to the metallic adhesion layer coated on each pad and a second part formed on an outside area of the pads. The method includes applying a resist layer on the metallic adhesion material. The method also includes patterning the resist layer to fabricate the mold layer. The method includes stripping the mold layer from the substrate, thereby leaving the bump on the substrate, in which each bump includes the solder cap and the bump base formed on the pad. The method further includes removing the second part of the metallic adhesion material exposed from the bumps. It also allows us to employ other functional material such as a Ti barrier as the metallic adhesion material even if the material is insolvable to the solder material such as molten solder. In this particular embodiment, the metallic adhesion material may be selected from the group consisting of Cu, Ti, Ni, Au and any combination thereof.

In a particular embodiment, filling the solder material includes injecting molten solder into each opening of the mold layer. In this embodiment, no electro- and electroless-plating is required to fabricate the set of the bumps, thereby avoiding an expensive pillar and solder cap fabrication process, an expensive facility and a complicated management of the plating process.

In one preferable embodiment, the method includes removing surface oxide from the pads by reverse sputtering before the coating of the metallic adhesion layer and the metallic adhesion layer is coated on each pad by sputtering. The combination of the reverse sputtering and the sputtering of the metallic adhesion layer is preferable to reduce a time interval from surface oxide removal to surface coating of the pads.

In one particular embodiment, the substrate includes a semiconductor device, the set of the pads is formed on at least an active surface of the semiconductor device. The method further includes interconnecting the semiconductor device to external circuitry with the bump, so the method is a manufacturing method of an electronic device. A high-temperature condition of sintering would contribute to the strengthening of the bonding between the sintered pillar and the pad. However, the semiconductor devices generally degrade under such a high-temperature condition. The method according to the embodiment of the present invention enables the bonding between the bump base and the pad to be enhanced without the use of high temperature condition.

According to other embodiment of the present invention, a bump structure is provided. The bump structure including a substrate including a set of pads formed on a surface thereof, in which the pads include first conductive material. The bump structure includes also a set of bumps, each of which is formed on one of the pads. Each bump includes a metallic adhesion layer formed on the pad and a bump base formed on the metallic adhesion layer. The bump base is a sintered body of conductive particles including second conductive material different from the first conductive material.

The bump structure according to the embodiment of the present invention shows good reliability even if the pads are made of conductive material different from the conductive particles since the bumps made by sintering of conductive particles are tightly bonded to pads. Also, it enables the bonding between the bump base and the pad to be enhanced without the use of a high temperature condition. Hence, it is possible to prevent a degradation of the semiconductor device due to the bumping process.

In a preferred embodiment, each bump further includes a solder cap formed on the bump base. The bump base has a shape of a cup having a bottom bonded to the pad via the metallic adhesion layer and the cup is filled with solder material of the solder cap. In a particular embodiment, the first conductive material may include Al, the second conductive material may include Cu and the metallic adhesion layer may include material selected from the group consisting of Cu, Ti, Ni, Au and combination thereof.

In a preferred embodiment, the metallic adhesion layer covers a side surface of the bump base as a sidewall barrier. Thereby, the sidewall barrier prevents a short circuit between the bumps due to ion migration.

According to further other embodiment of the present invention, an electronic device is provided. The electronic device includes a semiconductor device including a set of pads formed on an active surface thereof, in which the pads include first conductive material. The electronic device also includes a set of bumps each formed on one of the pads. Each bump includes a metallic adhesion layer formed on the pad and a bump base formed on the metallic adhesion layer and the bump base is a sintered body of conductive particles including second conductive material different from the first conductive material. The electronic device further includes circuitry interconnected to the semiconductor device through the set of the bumps.

The electronic device according to the embodiment of the present invention shows good durability since the bumps made by sintering the conductive particles are tightly bonded to pads even if the pads are made of conductive material different from the conductive particle for bump base.

In a preferable embodiment, the metallic adhesion layer covers a side surface of the bump base as a sidewall barrier. The provision of the sidewall barrier prevents a short circuit between bumps due to ion migration.

According to another embodiment of the present invention, a method of manufacturing an electronic device is provided. The method includes preparing a bumped semiconductor device. The bumped semiconductor device includes a substrate including a set of pads formed on a surface thereof, wherein the pads include first conductive material. The bumped semiconductor device also includes a set of bumps each formed on one of the pads, in which each bump includes a metallic adhesion layer formed on the pad and a bump base formed on the metallic adhesion layer and the bump base is a sintered body of conductive particles including second conductive material different from the first conductive material. The method further includes interconnecting the bumped semiconductor device to external circuitry through the set of the bumps.

The electronic device provided by the method according to the embodiment of the present invention shows good durability since the bumps made by sintering the conductive particles are tightly bonded to pads even if the pads are made of conductive material different from the conductive particle for bump base.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing. In the drawings:

FIGS. 1A and 1B illustrate a cross-sectional view and a top view of a bump structure according to an exemplary embodiment of the present invention, respectively;

DETAILED DESCRIPTION

Figure 2A:
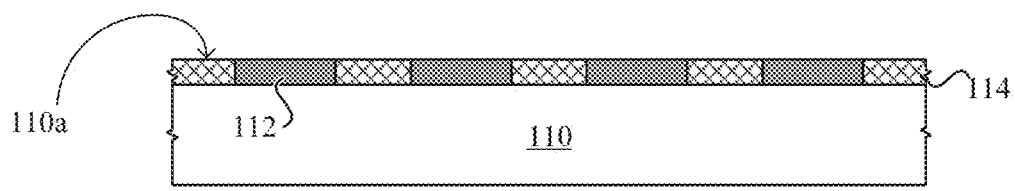
FIGS. 2A-2E illustrate cross-sectional views of a structure obtained at each step of a bumping process according to an exemplary embodiment of the present invention (1/2)

Hereinafter, the present invention will be described with respect to particular embodiments, but it will be understood by those skilled in the art that the embodiments described below are mentioned only by way of examples and are not intended to limit the scope of the present invention.

One or more embodiments according to the present invention are directed to a method of fabricating a bump structure, an associated bump structure, an associated electronic device including a bump structure, and an associated method of manufacturing an electronic device including a bump structure, in which a set of bumps tightly bonded to respective pads of a substrate is achieved.

Hereinafter, with reference to FIGS. 1A and 1B, a bump structure according to an exemplary embodiment of the present invention is described. FIG. 1A illustrates a cross-sectional view of a bump structure 100. FIG. 1B shows a top view of the bump structure 100. Note that the cross-sectional view shown in FIG. 1A corresponds to a cross-section indicated by "A" in the top view of FIG. 1B.

The bump structure 100 shown in FIG. 1 includes a substrate 110 including a set of pads 112 and a passivation layer 114 formed on the surface of the substrate 110. The bump structure 100 also includes a set of bumps 120, each of which is formed on corresponding one of the pads 112. Note that reference numerals related to the bump 120 are indicated in relation to only one representative bump in the figure instead of all elements, for convenience.

The substrate 110 may be any substrate made of semiconductor material. In a particular embodiment, the substrate 110 is a wafer (or panel) that a plurality of electronic devices is built in. In this particular embodiment, the wafer may be separated into plural chips (or dice) finally. In other particular embodiment, the substrate 110 is a chip separated from the wafer. Both of the wafer and the chip are semiconductor devices in the described embodiment. The wafer and the chip may be made of silicon, III-V or II-VI compound semiconductor materials or other semiconductor materials. The wafer and the chip may be fabricated by any standard semiconductor process, including FEOL (Front End Of Line) and BEOL (Back End Of Line) processes. Although the substrate 110 is described to be a semiconductor device in the described embodiment, however, any other substrates such as a ceramic substrate and glass substrate, a printed circuit board may be used as the substrate 110.

The pads 112 is made of conductive material. Examples of the conductive material may generally include metals such as aluminum (Al), copper (Cu), cobalt (Co) and other metal material. Hereinafter, the case where the pad 112 is made of Al will be mainly described as an example to which the present bumping technique is applicable. The pads 112 may be located on the surface of the substrate 110 with certain pitch (e.g. 20-300 micrometers). As shown in FIG. 1B, the set of the pads 112 is formed in a 2-dimensional array. The passivation layer 114 may include insulating material such as silicon oxide ($SiO_2$), for example.

Although not shown in FIGS. 1A-1B, in addition to the set of the bumps 120, the substrate 110 may include an electronic element, an optoelectronic element such as photodiodes (PDs) and light emitting diodes (LEDs) and/or a plurality of wiring layers connected to the bumps 120. The substrate 110 may also have a stack of semiconductor substrates.

FIG. 1A also depicts more detailed structure of each bump 120. As shown in FIG. 1A, each bump 120 includes a metallic adhesion layer 126 formed on the pad 112 and a bump base 122 formed on the pad 112 via the metallic adhesion layer 126. Each bump 120 may further include a solder cap 124 formed on the bump base 122. Note that the metallic adhesion layer 126 is a kind of an under bump metallurgy (UBM).

The bump base 122 is made of conductive material, which may generally include copper (Cu), nickel (Ni) silver (Ag), gold (Au) or other metal material. Each bump base 122 is fabricated by sintering the conductive particles using a mold layer or resist layer disposed on the substrate 110. So the bump base 122 is a sintered body of conductive particles including conductive material different from that of the pad 112. Hereinafter, the case where the bump base 122 is made of copper will be mainly described as an example to which the present bumping technique is applicable. Hence, the conductive particles are copper particle and the bump base 122 is a sintered body of the copper particles.

In a preferable embodiment, copper nano-particles, copper micro-particles and their mixture are used for bump base formation. The sintered body of the conductive particles would have porous morphology. The size of particles may range from 1 nm to 15 µm.

The bump base 122 has a shape of a cup having a bottom that is bonded to the pad 112 via the metallic adhesion layer 126. The cup of the bump base 122 is filled with solder material of the solder cap 124.

The metallic adhesion layer 126 is made of metal material selected from the group consisting of Cu, Ti, Ni, Au and combination of aforementioned elements. The metallic adhesion layer 126 may include a single layer or a plurality of layers (or a stack), each of which includes an aforementioned element as a pure metal or two or more aforementioned elements as an alloy. In particular embodiments, the metallic adhesion layer 126 is a stack of Ti/Cu, a layer or a stack of Cu, Au, and/or Ni.

The solder material of the solder cap 124 may have any appropriate composition. In one or more embodiments, any of lead-free solder alloys including binary, ternary and quaternary systems of one or more elements selected from the group consisting of tin, bismuth, silver, indium, antimony, copper, zinc, nickel, aluminum, manganese and palladium, may be used as the solder material. Examples of the lead-free solder alloys may include Bi—Sn, Sn—Ag, Sn—Ag—Bi, Sn—Ag—Cu, Sn—Cu alloys, to name but a few. With the high degree of freedom regarding the composition of the solder, any composition suitable for the bumping may be selected.

Hereinafter, referring to a series of FIGS. 2A-2E and FIGS. 3A-3D, a bumping process for fabricating a bump structure according to an exemplary embodiment of the present invention is described. FIGS. 2A-2E and FIGS. 3A-3D illustrate cross-sectional views of a structure obtained at each step of the bumping process, which fabricates the bump structure 100 shown in FIGS. 1A and 1B.

As shown in FIG. 2A, the bumping process may include a step of preparing a substrate 110 including a set of pads 112 and a passivation layer 114 formed on the surface 110a of the substrate 110. In a particular embodiment, the bumping process is conducted as a wafer level process and the substrate 110 is a wafer where a plurality of integrated circuits is built in. Each pad 112 may include conductive material. When the pad 112 is formed of a metal easily oxidized such as Al, the bumping process may also include a step of removing surface oxide from the pads 112. The removal of the surface oxide may be done by virtually any standard means including reverse sputtering, etching with an acidic solution, for example.

Figure 2B:
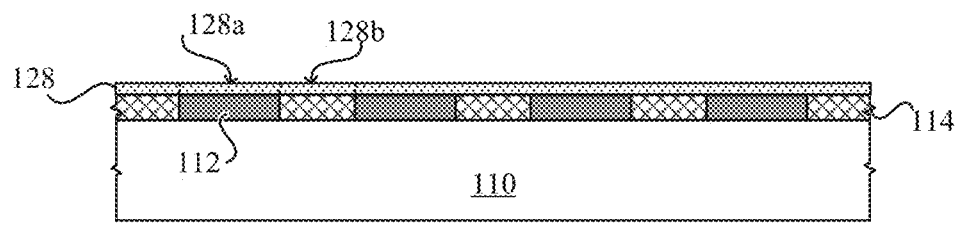

As shown in FIG. 2B, the bumping process may include a step of depositing metallic adhesion material 128 over the surface 110a of the prepared substrate 110. The deposited metallic adhesion material 128 may include first parts 128a and a second part 128b. The first parts correspond to the metallic adhesion layers 126 coated on the pads 112. The second part 128b is a part formed on an outside area of the pads 112, where the passivation layer 114 may be generally formed. Any known seed layer typically used for electroplating of pillars may be used as the metallic adhesion material 128. The metallic adhesion material is selected from the group consisting of Cu, Ti, Ni, Au and combination thereof. In a particular embodiment, the metallic adhesion layer 126 is a stack of Ti/Cu, a layer or a stack of Cu, Au, and/or Ni. The deposition of the metallic adhesion material 128 may be conducted by virtually any standard means including sputtering, electroless-plating, for example. Note that the sputtering may give a metallic adhesion layer on the whole area whereas the electroless-plating may give a metallic adhesion layer on a limited area including the pads 112.

Although the removal of the surface oxide and the deposition of the metallic adhesion material 128 are performed by virtually any standard means, a combination of the reverse sputtering and the sputtering of the metallic adhesion material is preferably employed to reduce a time interval from surface oxide removal to surface protection of the pads 112 when the pads 112 are formed of a metal easily and persistently oxidized such as Al. Long time interval would cause degradation of the bonding of the Al pads. Furthermore, this combination is advantageous in a viewpoint of eliminating the plating process, which is generally expensive itself, and requires expensive facility and complicated management of the plating process.

Figure 2C:
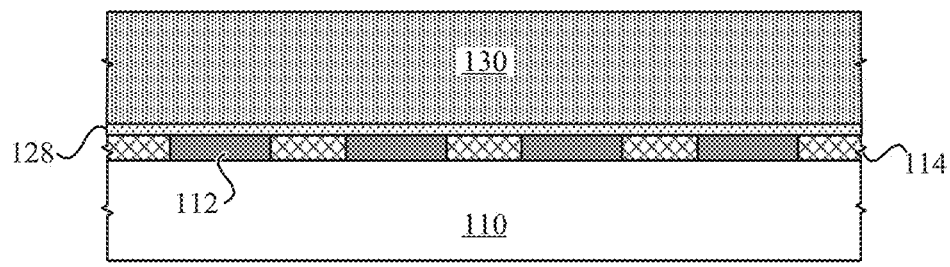

As shown in FIG. 2C, the bumping process may also include a step of applying a resist layer 130 on the metallic adhesion material 128. Any of known liquid or film photoresists of positive or negative type may be used. The resist layer 130 may be applied by virtually any standard means including spin coating, film lamination.

Figure 2D:
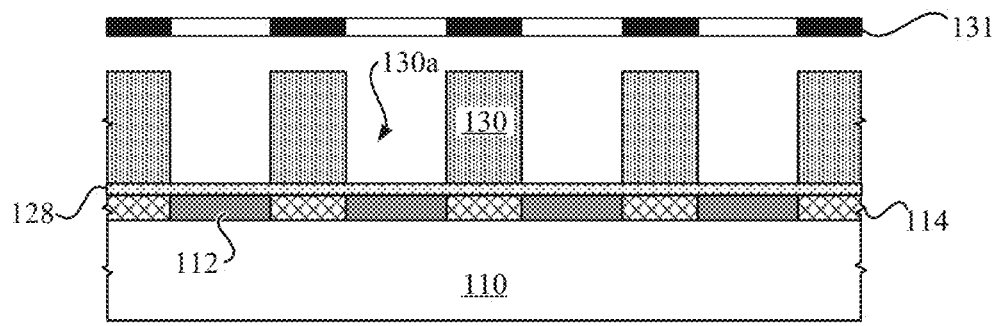

As shown in FIG. 2D, the bumping process may also include a step of patterning the resist layer 130 to have a set of openings 130a formed through the resist layer 130. Each opening 130a is aligned with a corresponding pad 112. The opening 130a exposes the surface of the metallic adhesion material 128 on the pad 112. The patterned resist layer 130 may work as a mold layer for shaping material filled in the openings 130a. The opening 130a may have any shape, which may include, but is not limited to, a round shape, a square shape, a rounded square shape, to name but a few. Note that when the electroless-plating is employed to deposit the metallic adhesion material 128, the electroless-plating may be conducted after this resist patterning.

The resist layer 130 may be patterned by virtually any standard means including photolithography. In a particular embodiment, the step of the patterning may include sub-steps of exposing the photoresist material with a photomask 131 and developing the exposed photoresist material so as to open the openings 130a at positions aligned with the pads 112. In the embodiment shown in FIG. 2D, the photomask 131 is a dark filed mask and the resist material is positive type without limitation.

The resist layer 130 may has a designed thickness that may provide an adequate height for bumping. The diameter of the opening 130a may affect the size of the bump 120 finally obtained. In one embodiment, the diameter of the opening 130a may range from 5 micrometers to 150 micrometers. Also, the space of the opening 130a may provide room to accommodate conductive material that would be filled by subsequent filling steps.

Figure 2E:
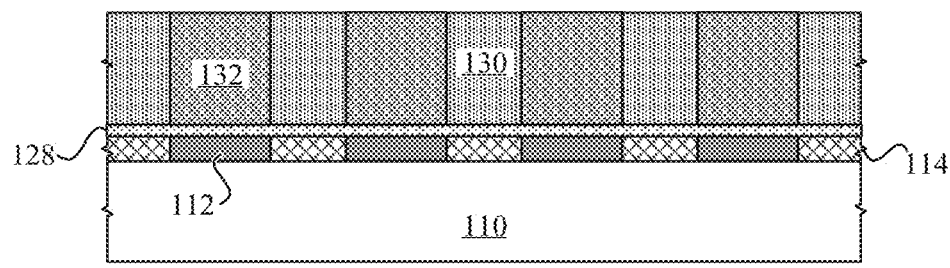

As shown in FIG. 2E, the bumping process may also include a step of filling conductive particles 132 into the openings 130a of the resist layer 130. The conductive particles 132 may include conductive material different from that of the pad 112. Examples of the conductive particles may include copper (Cu), nickel (Ni), silver (Ag) and gold (Au), for example. In a preferable embodiment, the conductive particles may be copper (Cu) particles. Nano-particles, micro-particles and their mixture may be used as the conductive particles 132.

The diameter of the conductive particles may range from 1 nm to 15 µm.

In the described embodiment, the conductive particles are provided in a form of a paste. The filling of the conductive particle (also referred to as the conductive paste) 132, hereinafter) may be done by virtually any standard means including screen-printing and injecting techniques, for example. The conductive particles may be immersed in organic solvent. The viscosity of the conductive paste 132 and the particle fraction in the conductive paste 132 may be determined in consideration of paste shrinkage, in other words, the thickness of a conductive layer to be obtained by sintering of the next step.

Figure 3A:
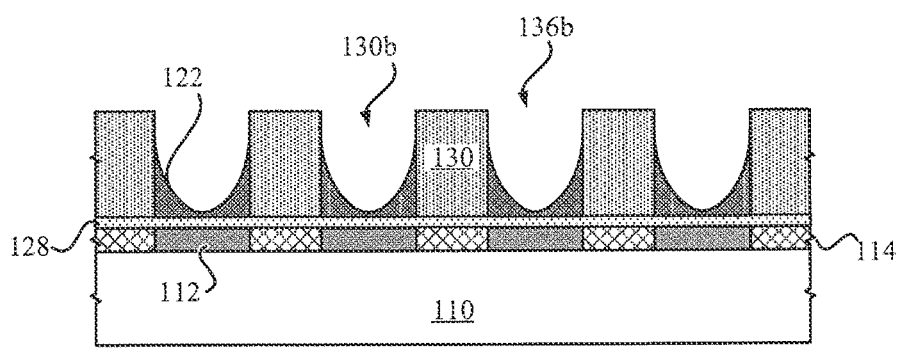
FIGS. 3A-3D illustrate cross-sectional views of a structure obtained at each step of the bumping process according to the exemplary embodiment of the present invention (2/2)

As shown in FIG. 3A, the bumping process may also include a step of sintering conductive paste 132. The conductive paste 132 filled in each opening 130a of the resist layer 130 is sintered to form a bump base 122 on each pad 112. The sintering of the conductive paste 132 in the opening 130a is performed to heat the conductive paste 132 at 100 to 250 Celsius degrees for 0.1 to 2.0 hours in an atmosphere of nitrogen gas or formic acid to prevent oxidation of the metal surface after the sintering. If the sintering is performed in air, an oxide layer on the metal surface may be removed.

The sintering is a process of forming a solid mass of material by heat and/or pressure without melting the material to the point of liquefaction. In the sintering process, the conductive paste 132 is shrunk so that the bump base 122 is formed to cover the sidewall of the opening 130a of the resist layer 130 and the surface of the pad 112 (i.e. the metallic adhesion material 128) as shown in FIG. 3A. As a result, the bump base 122 formed on each pad 112 would have a shape of a cup conforming to the contour of the opening 130a and have a bottom tightly bonded to the pad 112 via the metallic adhesion material 128. Since solder filling is performed in the next step without additional conductive paste coating, the volume shrinkage of the conductive paste 132 after sintering is optimized. The volume shrinkage of the conductive paste 132 is dependent on the design value of the bump diameter/height, and for example is preferably 50% or more.

The bump base 122 corresponds to a metal pillar (or post). The space 136b remains on the bump base 122 reaching the upper end of the opening 130a. The bump base 122 has a cone-shaped surface as shown in FIG. 3A. The cross-section of the bump base 122 has a conformal shape.

In the described embodiment, the step of filling the conductive paste 132 and the step of sintering the conductive paste 132 are performed at once, respectively. However, when the thickness of the central portion of the bump base 122 is thinner than a predetermined thickness, which may be in the range of 1 to 50 µm, for example, the conductive paste filling step and the sintering step are performed multiple times alternatingly to form one or more additional conductive layers to ensure a predetermined thickness of the bump base 122.

Figure 3B:
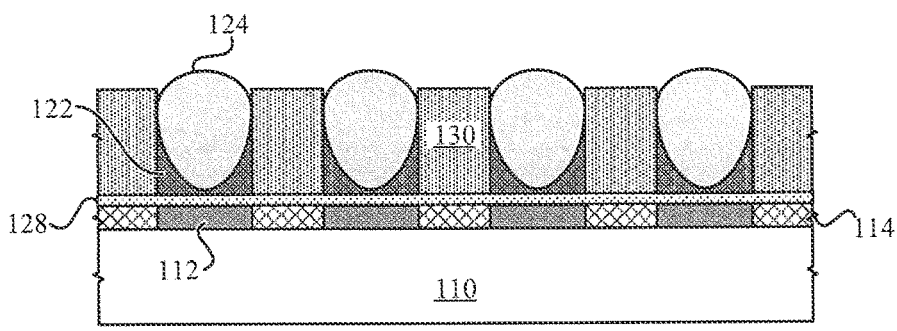

As shown in FIG. 3B, the bumping process may also include a step of filling solder material into the remaining space 130b in each opening 130a above the bump base 122 to form a solder cap 124 on each bump base 122. In a preferable embodiment, the solder material may be filled by injecting molten solder into each opening 130a of the resist layer 130. The injecting of the molten solder may be done by IMS process, for example. The existence of the bump base 122 covering the sidewall of the opening 130a of the resist layer 130 would facilitate filling of the openings 130a with the solder material. In the IMS process, a molten solder is injected into each opening 130a under a vacuum or reduced pressure condition by using a fill head. The injected molten solder is solidified in each opening 130a. The fill head includes a reservoir of the molten solder and a slot through which the molten solder is injected. The solder cap 124 may have a convex top surface.

Figure 3C:
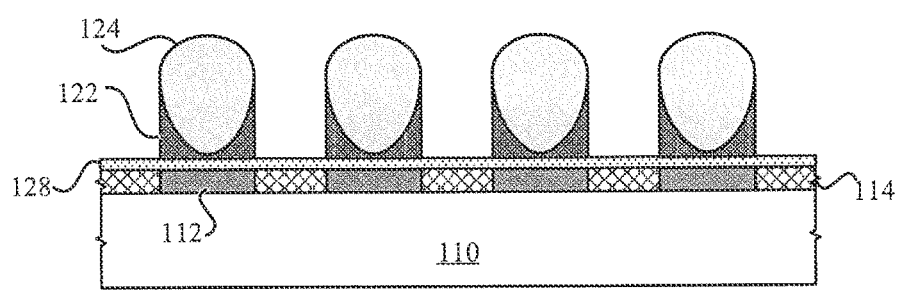

As shown in FIG. 3C, the bumping process may also include a step of stripping the resist layer 130 from the substrate 110, thereby leaving the bump 120 on the substrate 110.

Figure 3D:
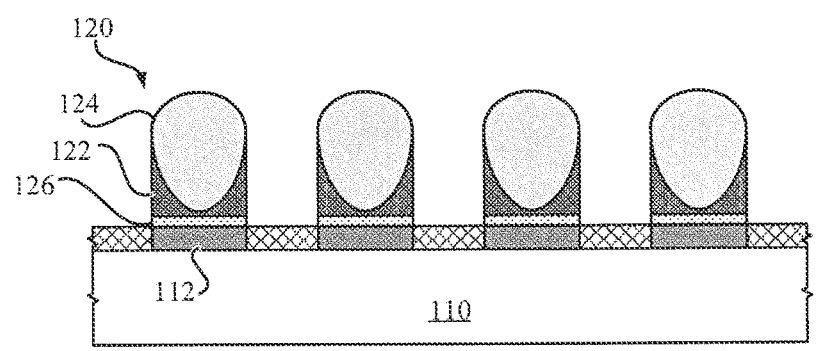

As shown in FIG. 3D, the bumping process may also include a step of removing the second part 128b of the metallic adhesion material 128 exposed from the bumps 120. The removal of the metallic adhesion material 128 may be done by any standard means including wet or dry etching.

The bump structure 100 of FIG. 3D may be used as an embodiment of the present invention. The bump structure 100 may be used for flip-chip bonding after the substrate 110 is divided into a plurality of chips when the substrate 110 is the wafer.

The present bumping process enables fabrication of the bump structure including the set of the bumps 120 on the substrate 110, in which the bumps 120 made by sintering the conductive paste 132 are tightly bonded to the pads 112 of the substrate 110 even though the pads 112 are made of conductive material (i.e. Al in the described embodiment) different from the conductive particles for sintering (i.e. Cu in the described embodiment). Generally, semiconductor devices include Al pads at the outermost layer. Hence, it is possible to fabricate the sintered bump base 122 tightly bonded to the pads 112 for practical use.

Furthermore, since the bump base 122 is fabricated by sintering the conductive particles 132 and the solder cap 124 is fabricated by injecting molten solder, no electro- and electroless-plating processes are required to fabricate main structures of the bumps, thereby avoiding expensive pillar and solder cap fabrication process, expensive facility and complicated management of the plating process.

In the aforementioned embodiment, the removal of the extra metallic adhesion material is conducted after the resist stripping. However, in other embodiments, the removal of the metallic adhesion material may be omitted.

Hereinafter, referring to a series of FIGS. 4A-4D and FIGS. 5A-5D, an improved bumping process according to other embodiment of the present invention, in which the removal of the metallic adhesion material is omitted, is described. FIGS. 4A-4D and FIGS. 5A-5D illustrate cross-sectional views of a structure obtained at each step of the improved bumping process.

Figure 4A:
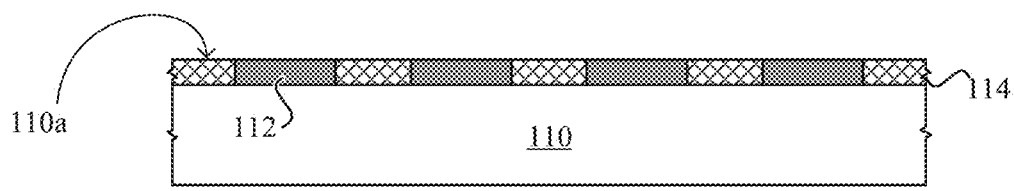
FIGS. 4A-4D illustrate cross-sectional views of a structure obtained at each step of a bumping process according to other embodiment of the present invention (1/2)
Figure 4B:
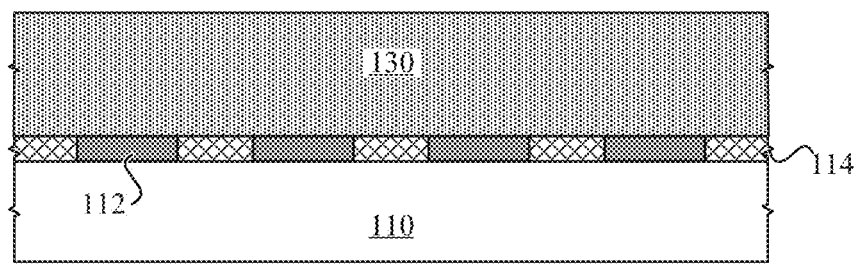
Figure 4C:
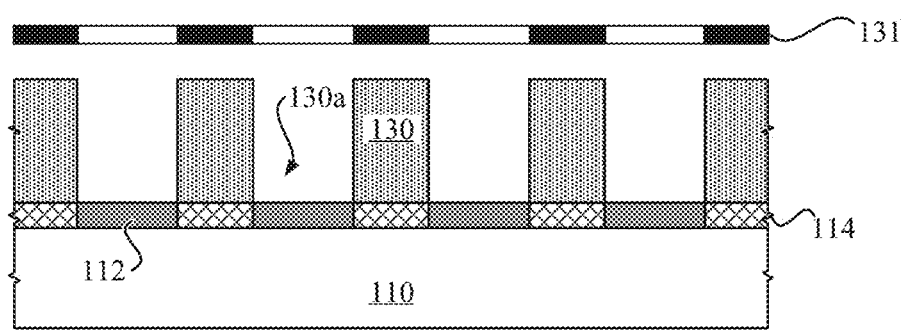

As shown in FIG. 4A, the bumping process may include a step of preparing a substrate 110 with a set of pads 112 and a passivation layer 114 formed thereon. As shown in FIG. 2B, the bumping process may also include a step of applying a resist layer 130 over the surface 110a of the substrate 110.

As shown in FIG. 2C, the bumping process may further include a step of patterning the resist layer 130 to have a set of openings 130a aligned with respective pads 112. The opening 130a exposes the surface of the pad 112. The photoresist material is exposed with a photomask 131 and developed to open the openings 130a at positions aligned with the pads 112. When the pad 112 is formed of a metal easily oxidized such as Al, the bumping process may also include a step of removing surface oxide from the pads 112.

Figure 4D:
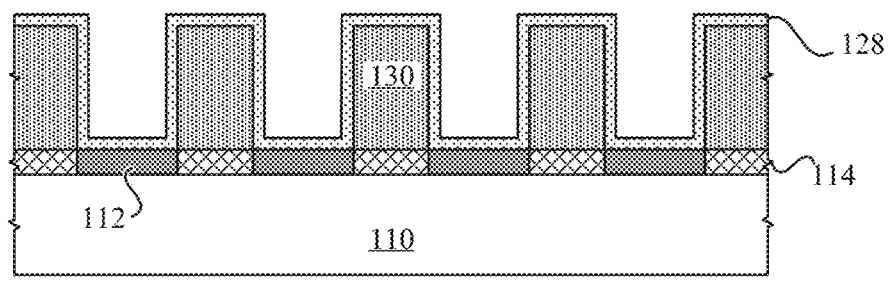

As shown in FIG. 4D, the bumping process may include a step of depositing metallic adhesion material 128 over the surface of the pads 112 and the top surface of the resist layer 130. The metallic adhesion material 128 is deposited so as to conform to the contour of the resist layer 130. In this embodiment, the metallic adhesion material is selected from the group consisting of Cu, Ni, Au and combination thereof. In a particular embodiment, the metallic adhesion layer 126 is a layer or a stack of Cu, Au, and/or Ni.

As similar to the aforementioned embodiment, the combination of the reverse sputtering and the sputtering of the metallic adhesion material is preferably employed when the pad 112 is formed of a metal easily and persistently oxidized such as Al.

Figure 5A:
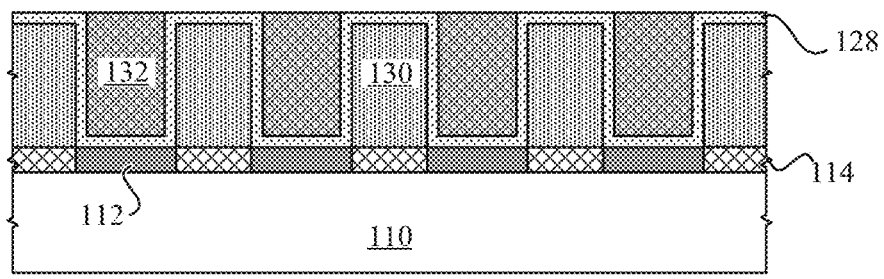
FIGS. 5A-5D illustrate cross-sectional views of a structure obtained at each step of the bumping process according to other embodiment of the present invention (2/2)
Figure 5B:
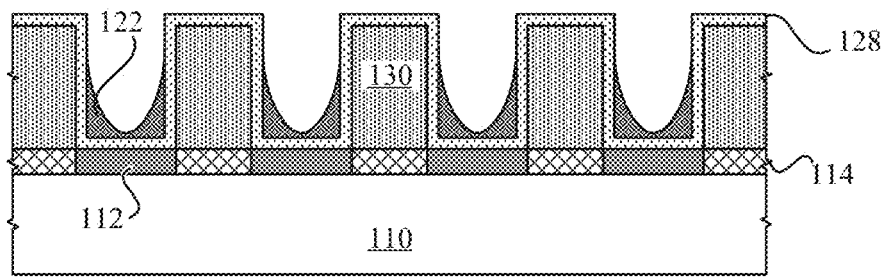

As shown in FIG. 5A, the bumping process may include a step of filling the conductive paste 132 into the openings 130a of the resist layer 130. As shown in FIG. 5B, the bumping process may include a step of sintering the conductive paste 132. The conductive paste 132 filled in the openings 130a are sintered to form a bump base 122 on each pad 112. In the sintering process, the conductive paste 132 is shrunk so that the bump base 122 is formed to cover the sidewall of the opening 130a and the surface of the pad 112 where both surfaces are now covered by the metallic adhesion material 128 as shown in FIG. 5B.

Figure 5C:
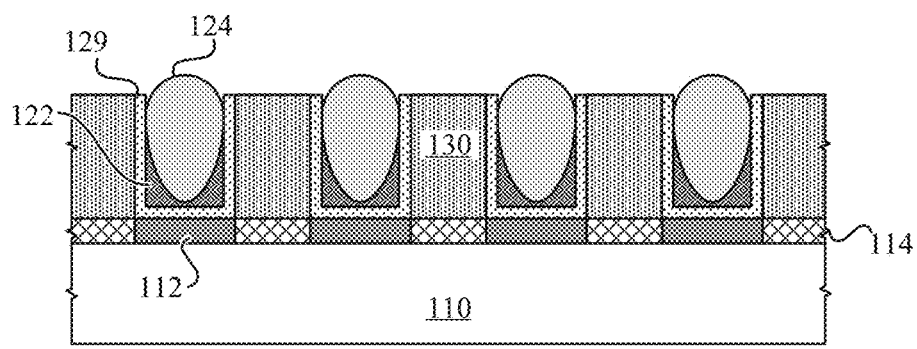

As shown in FIG. 5C, the bumping process may include a step of filling solder material into the remaining space 130b in each opening 130a above the bump base 122. In the described embodiment, the molten solder is injected into each opening 130a of the resist layer 130 to form a solder cap 124 on each bump base 122. The injecting of the molten solder may be done by IMS process, for example. In this embodiment, during IMS process, the metallic adhesion material 128 deposited on the top surface of the resist layer 130 would be dissolved into the molten solder since the metallic adhesion material 128 does not include any metal that is insolvable to the molten solder such as Ti. The part of the metallic adhesion material 128 (referred to as a sidewall metal 129) deposited on the sidewall of the opening 130a of the resist layer 130 may remain after the IMS process. In this embodiment, the sidewall metal 129 surrounds the bump base 122 and covers the side surface of the bump base 122. The sidewall metal 129 may work as a sidewall barrier (e.g. Ni) that prevents a short circuit between bumps due to ion migration.

Figure 5D:
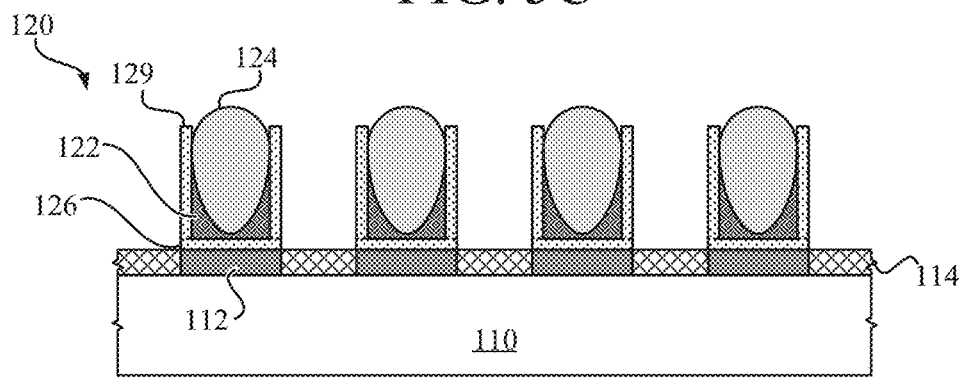

As shown in FIG. 5D, the bumping process may also include a step of stripping the resist layer 130 from the substrate 110, thereby leaving the bump 120 on the substrate 110. The step of removing the metallic adhesion material 128, which is performed in the process shown in FIGS. 2A-2E and FIGS. 3A-3D, is omitted.

Note that the striping step may be omitted if non-strip type resist is employed for forming the resist layer 130. Thus, the structure shown in FIG. 5C may also be used for subsequent flip chip bonding process without removing the resist layer 130.

In the embodiment shown in FIGS. 2A-2E and FIGS. 3A-3D, since the removal of the metallic adhesion material is introduced, it has an advantage capable of employing other functional material such as Ti barrier as the metallic adhesion material even if the material is insolvable to the solder material such as molten solder. On the other hand, in the embodiment shown in FIGS. 4A-4D and FIGS. 5A-5D, it is possible to omit the removal of the metallic adhesion material while removing extra metallic adhesion material sufficiently when the material insolvable to the molten solder such as Ti is not used. Since a removal process of a metallic layer underneath the resist layer after resist stripping is eliminated, undercut at the root of the bump is preferably prevented. Also associated process cost can be reduced. Cu, Ni and Au would be easily dissolved into the solder material such as molten solder during the filling process of the solder material.

Figure 6A:
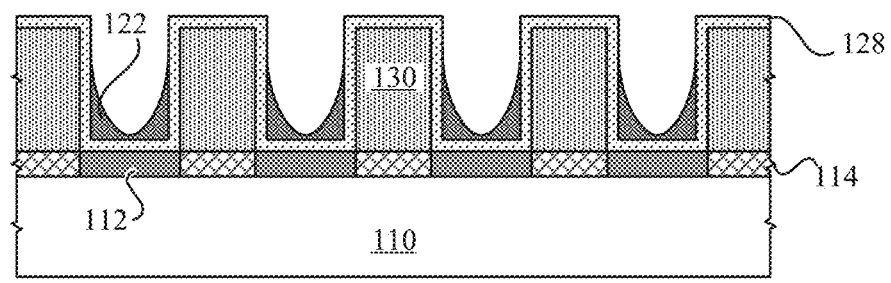
FIGS. 6A-6C illustrate cross-sectional views of a structure obtained at each step of a bumping process according to further other embodiment of the present invention.
Figure 6B:
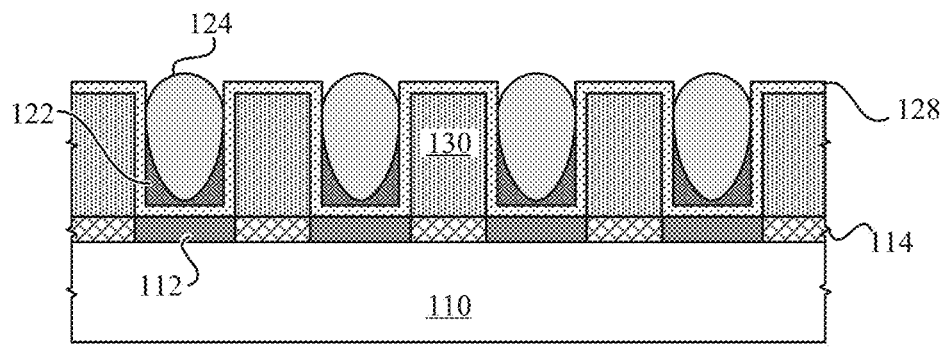
Figure 6C:
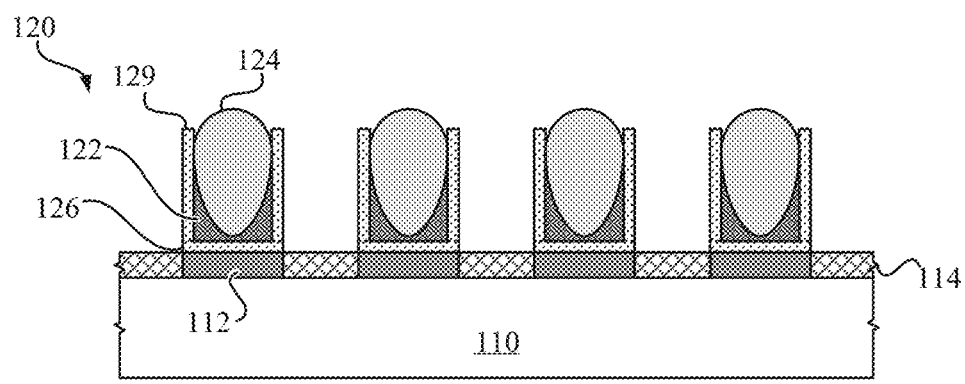

Hereinafter, referring to a series of FIGS. 6A-6C, an alternative bumping process according to further other embodiment of the present invention is described. FIGS. 6A-6C illustrate cross-sectional views of a structure obtained at each step of the alternative bumping process.

Note that this bumping process also includes steps described in FIGS. 4A-4D and FIG. 5A as similar to the aforementioned embodiment. Hence, the description will be made after the step of FIG. 5A is completed.

As shown in FIG. 6A, the bumping process may include a step of sintering the conductive paste 132. As shown in FIG. 6B, the bumping process may include a step of filling the solder material into the remaining space 130b of each opening 130a above the bump base 122 to form a solder cap 124 on each bump base 122. In this embodiment, the metallic adhesion material 128 deposited on the top surface of the resist layer 130 remains even after the IMS process.

As shown in FIG. 6C, the bumping process may include a step of stripping the resist layer 130 from the substrate 110. In this step, when the resist layer 130 is washed away, the metallic adhesion material on the top surface of the resist layer 130 is lifted-off and washed together with the resist layer 130 below. The separate step of removing the metallic adhesion material 128 is omitted. In this embodiment, the metallic adhesion material 128 is selected from the group consisting of Cu, Ti, Ni, Au and combination thereof.

In the embodiment shown in FIG. 4A-4D, FIG. 5A and FIGS. 6A-6C, as similar to the embodiment shown in FIGS. 4A-4D and FIGS. 5A-5D, the removal of the metallic adhesion material can be omitted regardless of composition of the metallic adhesion material. Thus, undercut at the root of the bump is preferably prevented. Also associated process cost can be reduced. Thus, it allows us to employ other functional material such as Ti barrier as the metallic adhesion material. Furthermore, in this embodiment, the metallic adhesion material conforming to the contour of the mold layer can work as a sidewall barrier that prevents a short circuit between bumps due to ion migration.

Hereinafter, referring to a series of FIGS. 7A-7D, a further alternative bumping process according to another embodiment of the present invention will be described. FIGS. 7A-7D illustrate cross-sectional views of a structure obtained at each step of the bumping process.

Note that this bumping process also includes the steps described in FIGS. 4A-4D and FIG. 5A as similar to the aforementioned embodiment. Hence, the description will be made after the step of FIG. 5A is completed.

Figure 7A:
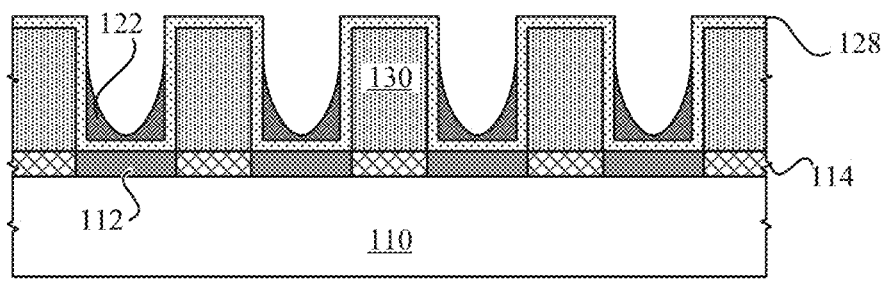
FIGS. 7A-7D illustrate cross-sectional views of a structure obtained at each step of a bumping process according to one other embodiment of the present invention.
Figure 7B:
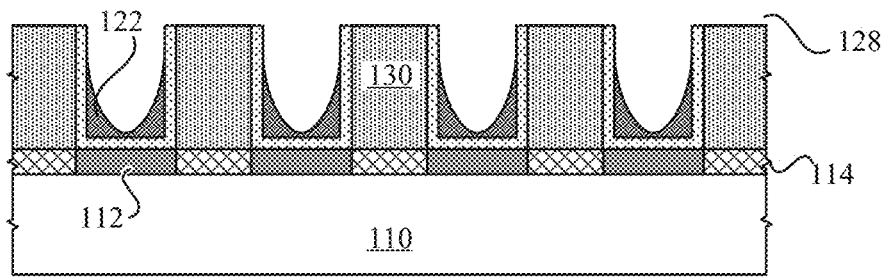

As shown in FIG. 7A, as similar to the aforementioned embodiment, the bumping process may include a step of sintering the conductive paste 132 to form bump base 122 on each pad 112. As shown in FIG. 7B, the bumping process may include a step of removing the metallic adhesion material 128 deposited on the top surface of the resist layer 130. The removing of the metallic adhesion material 128 may be done by a technique selected from the group consisting of chemical-mechanical polishing (CMP), mechanical polishing, fly-cutting and chemical etching.

Figure 7C:
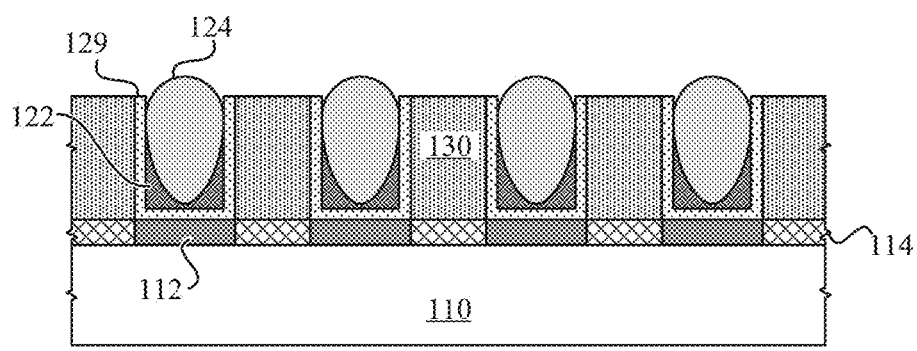
Figure 7D:
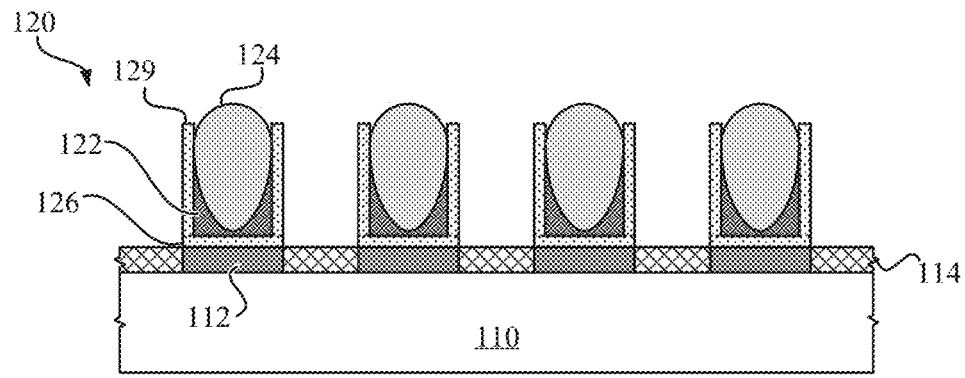

As shown in FIG. 7C, the bumping process may include a step of filling the solder material into the remaining space 130b in each opening 130a to form a solder cap 124 on each bump base 122. As shown in FIG. 7D, the bumping process may also include a step of stripping the resist layer 130 from the substrate 110. In this embodiment, the metallic adhesion material 128 is selected from the group consisting of Cu, Ti, Ni, Au and combination thereof.

In the embodiment shown in FIG. 4A-4D, FIG. 5A and FIGS. 7A-7D, even though a removal process of extra metallic adhesion material is performed before the resist stripping, however, the removal process of the metallic layer after the resist stripping, which would cause undercut at the root of the bump, is eliminated. It also allows us to employ other functional material such as Ti barrier as the metallic adhesion material. Furthermore, in this embodiment, the metallic adhesion material conforming to the contour of the mold layer can work as a sidewall barrier that prevents a short circuit between bumps due to ion migration.

Figure 8A:
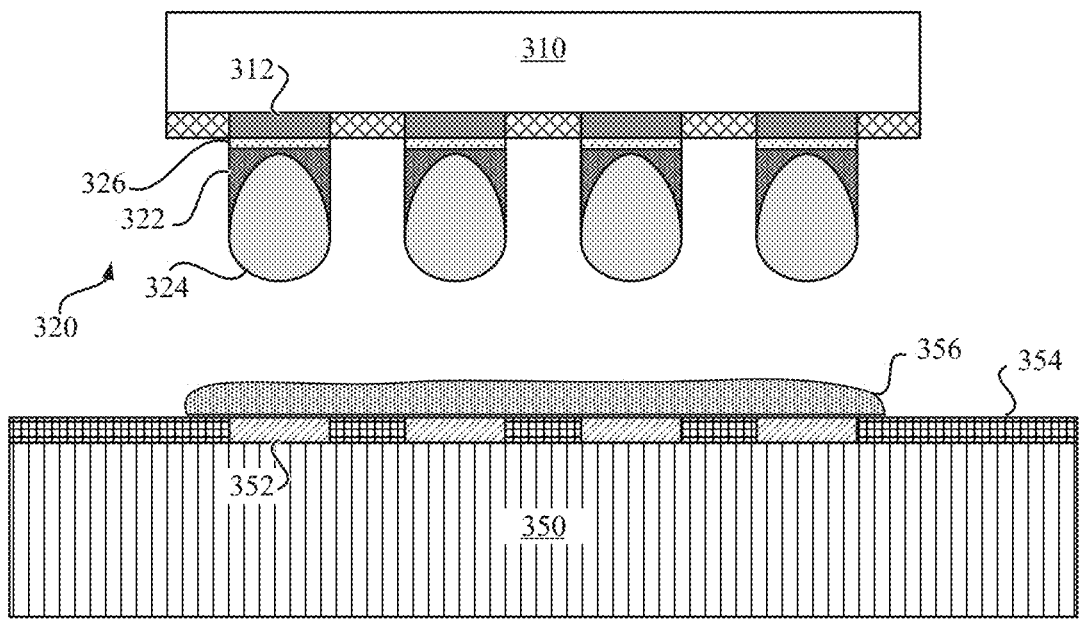
FIGS. 8A and 8B illustrate cross-sectional views of a structure obtained at each step of a flip-chip bonding process according to an exemplary embodiment of the present invention.
Figure 8B:
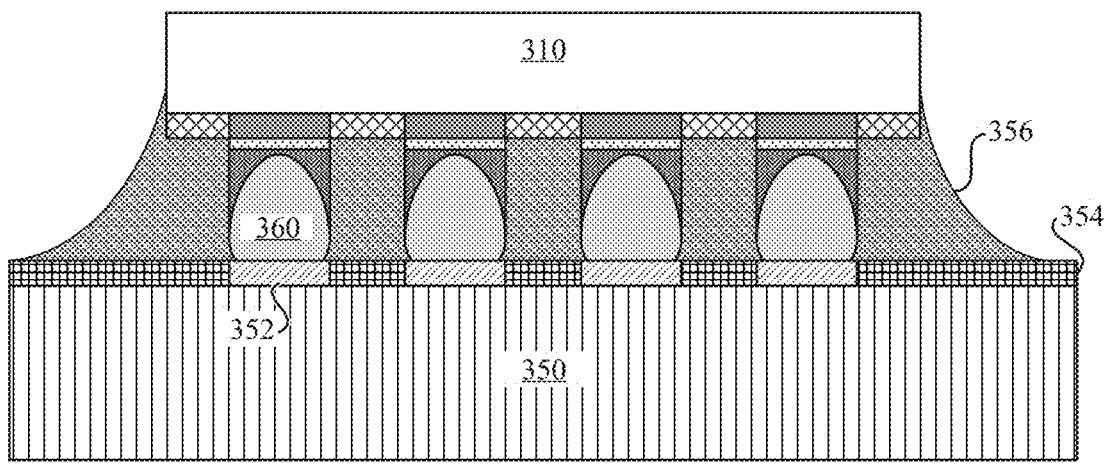

Hereinafter, with reference to FIGS. 8A and 8B, an electronic device and a flip-chip bonding process for manufacturing the electronic device according to an exemplary embodiment of the present invention are described. FIGS. 8A and 8B illustrate cross-sectional views of a structure obtained at each step of the flip-chip bonding process.

As shown in FIG. 8A, the flip-chip process may include a step of preparing a bumped semiconductor chip 310 that includes a set of bumps 320 formed on an active surface thereof. The flip-chip process may also include a step of preparing an organic substrate 350 that includes a set of contact pad 352 and a solder resist layer 354 formed on the surface thereof. The flip-chip process may also include a step of applying underfill 356 on the surface of the organic substrate 350.

The bumped semiconductor chip 310 prepared at this step is fabricated by any one of the aforementioned bumping processes, followed by the dicing process if the bumping process is performed at wafer level. As already described with reference to FIGS. 1A and 1B, each bump 320 includes a metallic adhesion layer 326 formed on the pad 312, a bump base 322 formed on the pad 312 via the metallic adhesion layer 326 and a solder cap 324 formed on the bump base 322.

As shown in FIG. 8B, the flip-chip process may include a step of mounting the bumped semiconductor chip 310 onto the organic substrate 350 such that the bumps 320 of the chip side are in contact with the contact pads 352 of the substrate side, respectively. The semiconductor chip 310 is flipped over so that its active surface faces down, and disposed so that the bumps 320 are aligned to the respective pads 352 on the organic substrate 350.

As also shown in FIG. 8B, the flip-chip process may further include a step of bonding the bumps 320 to the pad 352 to obtain the flip-chip joints 360. Appropriate one of the mount and reflow method and the thermal compression method may be done in a manner depending on desired size and pitch of the joints. The flip-chip process may also include a step of curing the underfill 356 to fix the semiconductor chip 310 to the organic substrate 350 rigidly.

By performing the step of mounting the bumped semiconductor chip 310 and the step of bonding the bumps 320 to the pad 352, the bumped semiconductor chip 310 is interconnected to the organic substrate 350, which includes external circuitry.

The electronic device manufactured by the aforementioned flip-chip bonding process shows good durability since the bumps 320 made by sintering the conductive particles are tightly bonded to the pads 312 even if the pads 312 are made of conductive material different from the conductive particle for bumping.

Hereinafter, with reference to a series of FIGS. 9A-9E, FIGS. 10A-10E, FIGS. 11A-11D, FIGS. 12A-12D and FIGS. 13A-13C, various related bumping processes will be described.

FIGS. 9A-9E illustrate cross-sectional views of a structure obtained at each step of a related bumping process including electroplating of both pillars and solder caps.

Figure 9A:
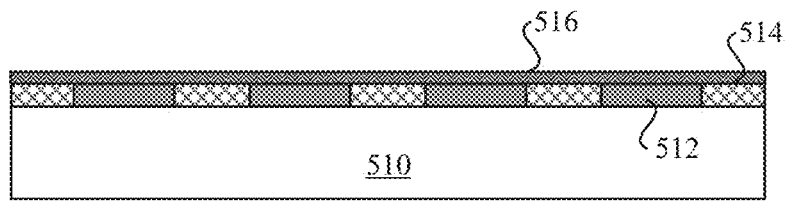
FIGS. 9A-9E illustrate related bumping process including electroplating of both pillars and solder caps.
Figure 9B:
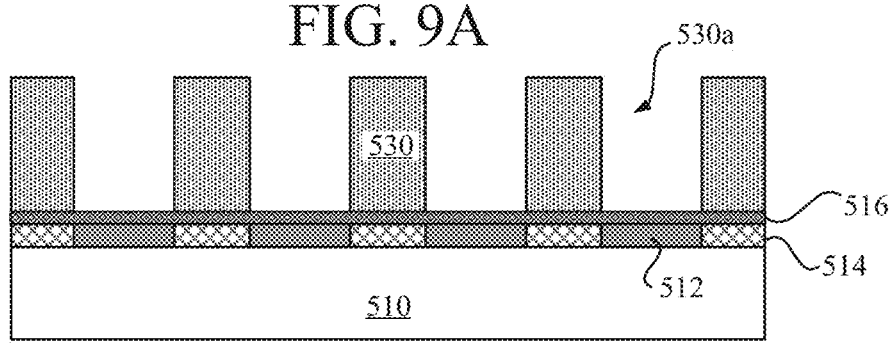
Figure 9C:
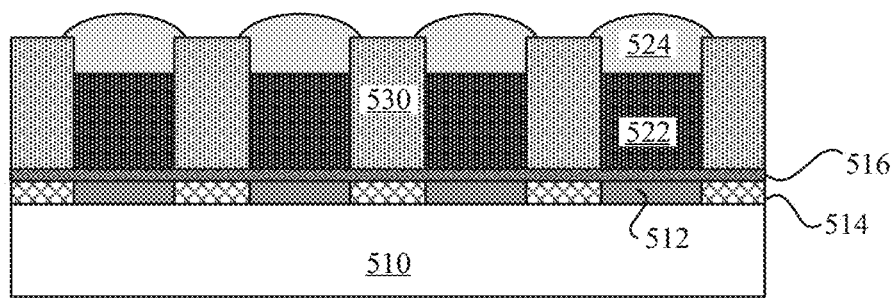
Figure 9D:
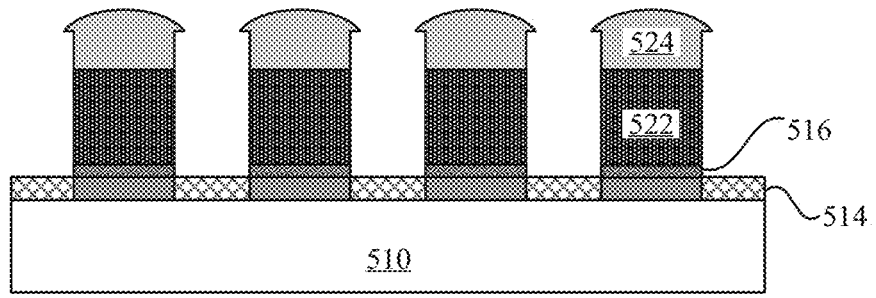
Figure 9E:
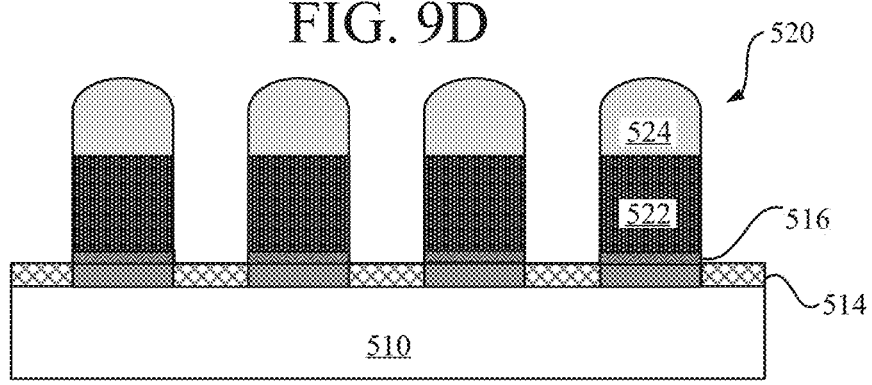

As shown in FIG. 9A, a seed layer 516 such as Ti/Cu layer is formed on the surface of the prepared wafer 510. As shown in FIG. 9B, a resist mask 530 having a set of holes 530a is patterned on the wafer 510. As shown in FIG. 9C, Cu is electroplated on the seed layer 516 in the holes 530a to form Cu pillars up to the middle of the holes 530a. As also shown in FIG. 9C, a solder layer 524 is deposited on the Cu pillars 522 by electroplating solder material over an upper bound of the holes 530b of the resist mask 530. As shown in FIG. 9D, the resist mask 530 is stripped from the wafer 510 and the seed layer 516 is etched. As shown in FIG. 9E, the solder layer 524 is then subjected to reflow with flux to form a solder capped bump 520 on the wafer 810.

Although the related bumping process shown in FIG. 9A-9E can fabricate Cu pillar bumps, however, it is difficult to tune composition of the electroplated solder with the high degree of freedom. Merely pure Sn or binary solder composition is known to be stably fabricated by electroplating method. Also, the expensive electroplating, the expensive facility and the complicated management of the plating process are required for both the pillars and the solder caps. Also, removal of the seed layer 516 after the resist stripping would cause undercut at the root of the bump 520.

FIGS. 10A-10E illustrate cross-sectional views of a structure obtained at each step of other related bumping process including electroplating of pillars and IMS of solder caps.

Figure 10A:
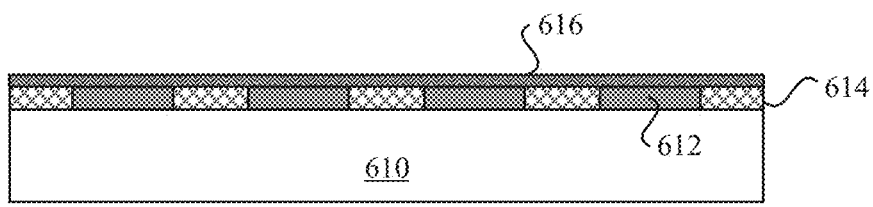
FIGS. 10A-10E illustrate other related bumping process including electroplating of pillars and IMS of solder caps.
Figure 10B:
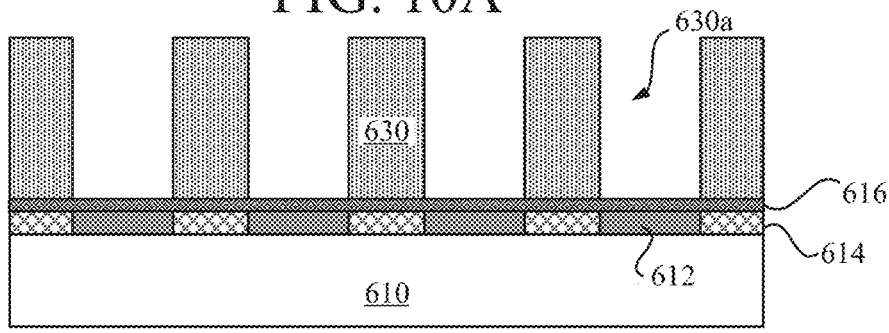
Figure 10C:
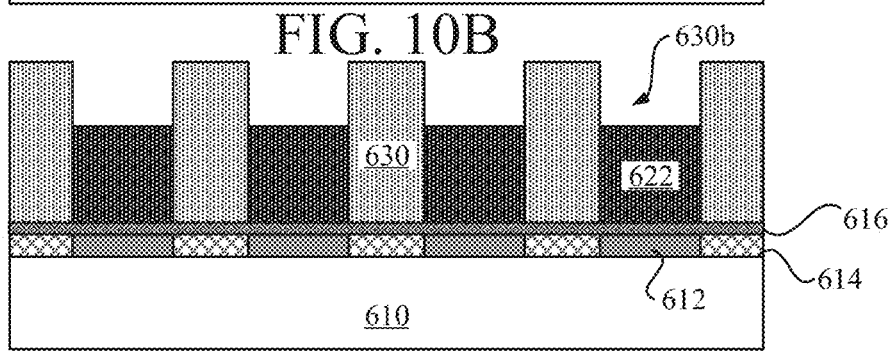
Figure 10D:
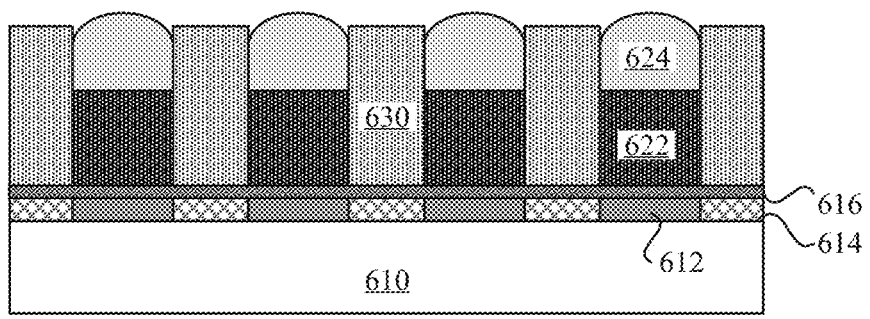
Figure 10E:
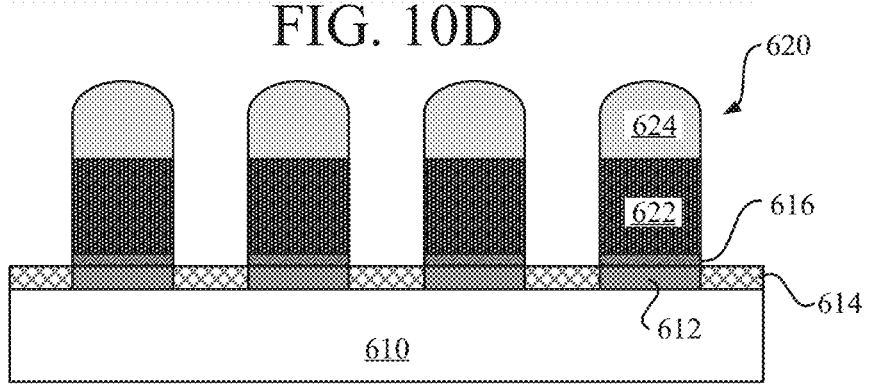

As shown in FIG. 10A, a seed layer 616 such as Ti/Cu layer is formed on a surface of a wafer 610. As shown in FIG. 10B, a resist mask 630 having a set of holes 630a is patterned on the wafer 610. As shown in FIG. 10C, Cu is electroplated on the seed layer 616 in the holes 630a to form Cu pillars up to the middle of the holes 630a. As shown in FIG. 10D, remaining space of the holes 630a in the resist mask 630 is filled with the solder material by IMS process to form solder caps 624 on the Cu pillars 622. As shown in FIG. 10E, the resist mask 630 is stripped from the wafer 610 and the seed layer 616 is etched.

Although expensive electroplating of the solder material may be omitted in the bumping process shown in FIG. 10A-10E, however, expensive electroplating of a Cu pillar, expensive facility and complicated management of the plating process are still required. Also, removal of the seed layer 616 after the resist stripping would cause undercut at the root of the bump 620.

FIGS. 11A-11D illustrate cross-sectional views of a structure obtained at each step of further other related bumping process including electroless-plating of pillars and IMS of solder caps.

Figure 11A:
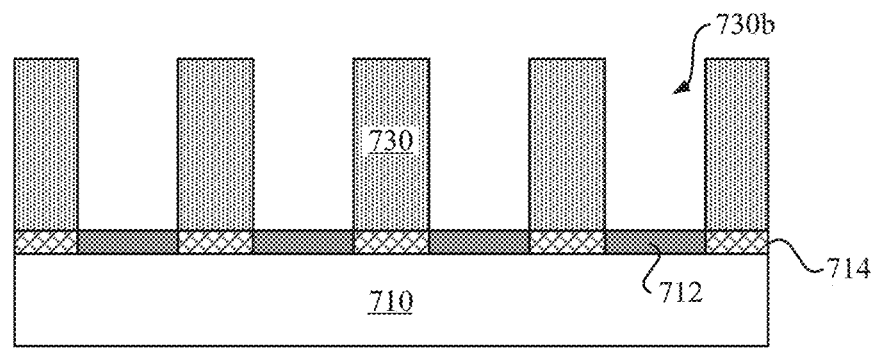
FIGS. 11A-11D illustrate further other related bumping process including electroless-plating of pillars and IMS of solder caps.
Figure 11B:
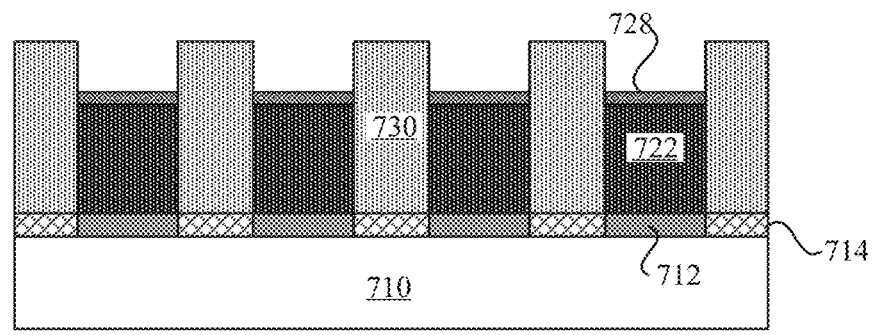
Figure 11C:
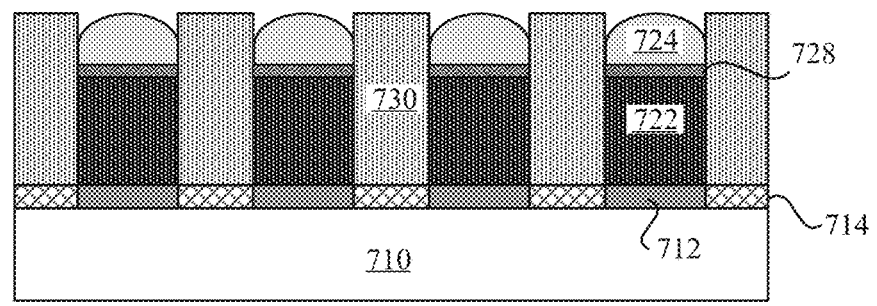
Figure 11D:
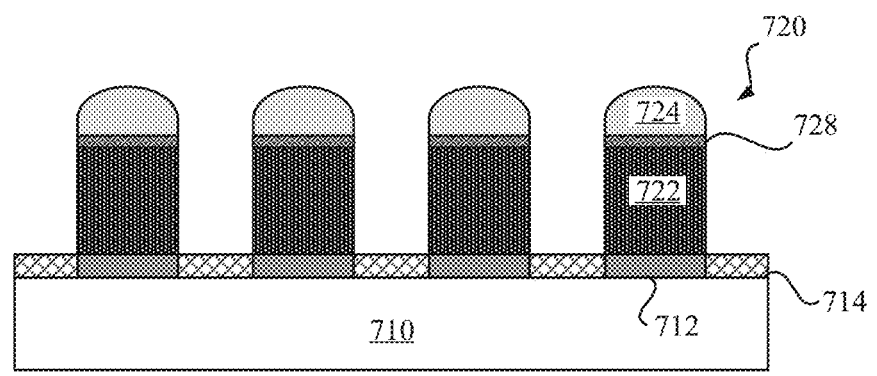

As shown in FIG. 11A, a resist mask 730 having a set of holes 730a is patterned on a wafer 710 including a set of pads 712 and a passivation layer 714. As shown in FIG. 11B, Ni is deposited on the pads 712 in the holes 730a by electroless-plating to form Ni pillars 722 up to the middle of the holes 730a and Au metal layer 728 is deposited on the Ni pillars 722. As shown in FIG. 11C, remaining space of the holes 730a in the resist mask 730 are filled with the solder material by IMS process to form solder caps 724 on the Ni pillars 722. As shown in FIG. 11D, the resist mask 730 is stripped from the wafer 710, leaving a set of Ni pillar bump 720, including the Ni pillar 722 and the solder cap 724, on the wafer 710.

Although the removal of the seed layer after the resist stripping may be omitted however, expensive electroless plating of a Ni pillar, expensive facility and complicated management of the plating process are still required.

FIGS. 12A-12D and FIGS. 13A-13C illustrate cross-sectional views of a structure obtained at each step of a related bumping process based on conductive paste sintering without the use of a metallic adhesion layer.

Figure 12A:
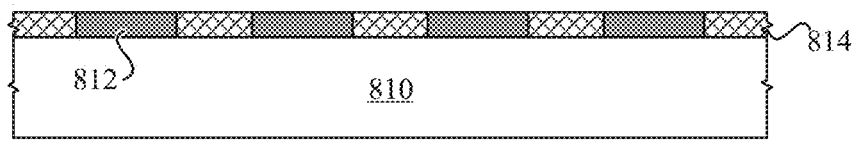
FIGS. 12A-12D illustrate another related bumping process based on conductive paste sintering without the use of a metallic adhesion layer (1/2)
Figure 12B:
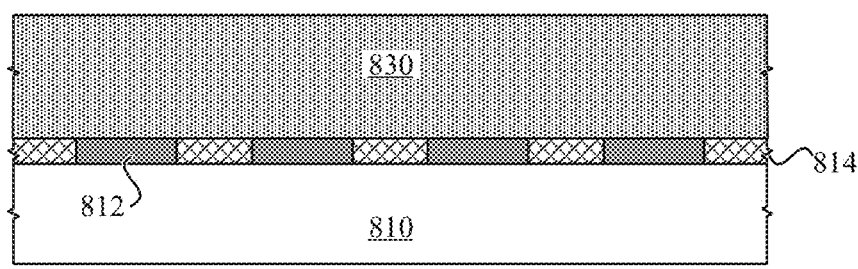
Figure 12C:
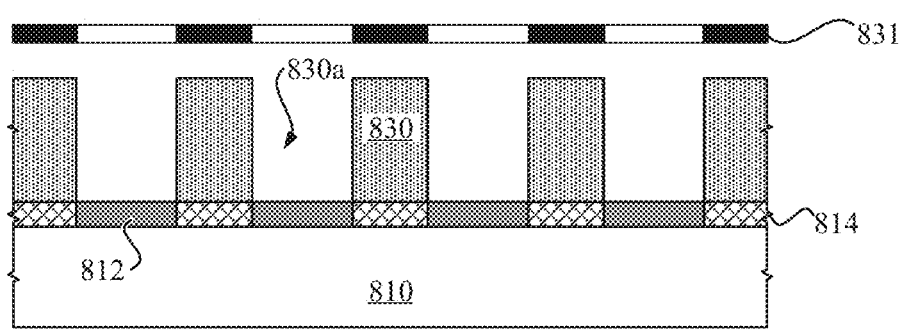

As shown in FIG. 12A, in the related bumping process, a wafer 810 that includes a set of pads 812 and a passivation layer 814 is provided. As shown in FIG. 12B, then, a resist mask 830 is formed on the surface of the wafer 810. As shown in FIG. 12C, the resist mask 830 is patterned using a photomask 831 to have a set of holes 830a. Each hole 830a is aligned to corresponding one of the pads 812.

Figure 12D:
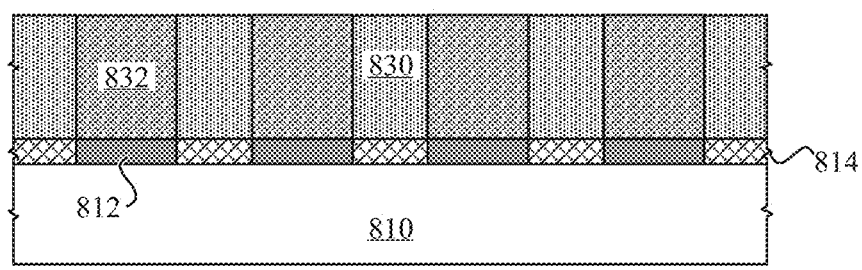
Figure 13A:
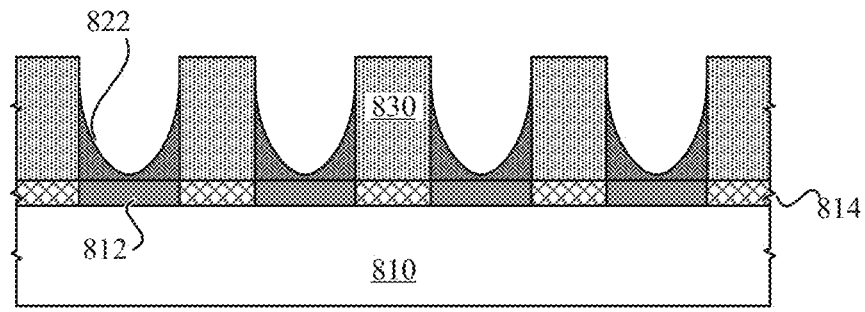
FIGS. 13A-13C illustrate another related bumping process based on the sintering process without the use of the metallic adhesion layer (2/2).

As shown in FIG. 12D, Cu paste 832 is filled into the holes 830a of the resist mask 830 up to the upper bound of the holes 830a. As shown in FIG. 13A, the Cu paste 832 filled in the holes 830a is cured to form a cup-shaped pillar 822 as a sintered body of Cu particles. Note that since this process employs sintering process to fabricate the copper pillar, a seed layer, which is required for electroplating of copper, is unnecessary. Rather, such unnecessary steps including the seed layer deposition and the seed layer removal after resist stripping may be avoid from a cost standpoint. Furthermore, the seed layer removal after the resist stripping may cause undercut at the root of the bump.

Figure 13B:
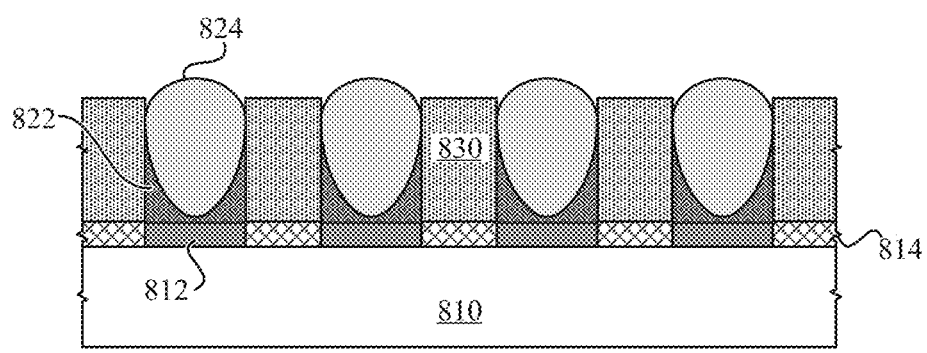
Figure 13C:
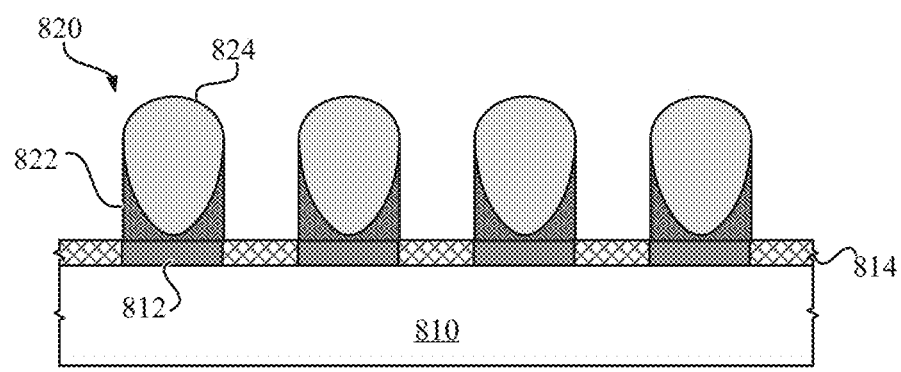

As shown in FIG. 13B, then, remaining space of the holes 830a in the resist mask 830 above the cup-shaped pillar 822 is filled with the solder material by IMS process to form solder caps 824 on the cup-shaped pillars 822. As shown in FIG. 13C, the resist mask 830 is stripped from the wafer 810, leaving, on the wafer 810, a set of Cu pillar bumps 820, each of which includes the cup-shaped pillar 822 and the solder cap 824.

By the bumping process shown in FIGS. 12A-12E and FIGS. 13A-13C, expensive plating of both Cu pillar solder caps, expensive facility and complicated management of the plating process can be avoided.

However, this process is limited to the case where the pads 812 and the pillar 822 are made of the same material, especially copper. As a result of intensive studies, the inventors have found that it is difficult to bond a sintered body of a conductive paste to a pad made of conductive material different from the conductive paste, e.g., bonding a sintered copper to an Al pad, under atmospheric pressure even just after removing the natural oxide film by the reverse sputtering. A high-temperature condition of the sintering is expected to contribute to strengthening of the bonding between the sintered pillar and the pad. However, the semiconductor devices generally degrade under such a high-temperature condition above temperature of typical reflow process, e.g., >300 Celsius degrees.

In contrast to the aforementioned related bumping process shown in FIGS. 12A-12D and FIGS. 13A-13C, the technique according to one or more embodiment of the present invention enables the bonding between the bump base and the pad to be enhanced without the use of high temperature condition. The metallic adhesion layer or UBM layer fabricated between the pad 112 and the conductive paste 132 (or the sintered bump base 122) maintains good bondability even if the conductive material different from the conductive particles is employed as the pad material. Hence, it is possible to prevent a degradation of the semiconductor device due to the bumping process.

Also in contrast to the aforementioned related bumping processes shown in FIGS. 9A-9E, FIGS. 10A-10E, FIGS. 11A-11D, FIG, the bumping processes according to one or more embodiments of the invention eliminates the necessity of the expensive electroplating of both the bump base and the solder cap and complicated management of the plating process, thereby reducing the production cost of the bumps.

As described above, according to one or more embodiments of the invention, a novel bumping technique capable of fabricating a bump structure including a set of bumps formed on a substrate, in which the bumps made by sintering conductive particles are tightly bonded to pads made of conductive material different from the conductive particles, is provided.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A bump structure comprising:
   a substrate including a set of pads formed on a surface thereof, wherein the pads comprise first conductive material; and
   a set of bumps each formed on one of the pads, wherein each of the bumps includes a pillarless metallic adhesion layer formed directly on the pad and a bump base formed directly on the metallic adhesion layer, and the bump base is a sintered body of conductive particles comprising second conductive material different from the first conductive material,
   wherein the pillarless metallic adhesion layer covers an entire top surface of the pad and forms an ion migration short-circuit protection sidewall barrier further covering a side surface of the bump base.

2. The bump structure of claim 1, wherein each of the bumps further includes a solder cap formed on the bump base, the bump base has a shape of a cup having a bottom bonded to the pad via the pillarless metallic adhesion layer and the cup is filled with solder material of the solder cap.

3. The bump structure of claim 1, wherein the first conductive material comprises Al, the second conductive material comprises Cu and the pillarless metallic adhesion layer comprises material selected from the group consisting of Cu, Ti, Ni, Au and combination thereof.

4. An electronic device comprising:
- a semiconductor device including a set of pads formed on an active surface thereof, wherein the pads comprise first conductive material; and
- a set of bumps each formed on one of the pads, wherein each of the bumps includes a pillarless metallic adhesion layer formed directly on the pad and a bump base formed directly on the metallic adhesion layer and the bump base is a sintered body of conductive particles comprising second conductive material different from the first conductive material; and
- circuitry interconnected to the semiconductor device through the set of the bumps,
- wherein the pillarless metallic adhesion layer covers an entire top surface of the pad and forms an ion migration short-circuit protection sidewall barrier further covering a side surface of the bump base.

5. The electronic device of claim 4, wherein each of the bumps further includes a solder joint connecting each bump base to a terminal contact of the circuitry, the bump base has a shape of a cup having a bottom bonded to the pad via the metallic adhesion layer and the cup is filled with solder material of the solder joint.

6. The electronic device of claim 4, wherein the first conductive material comprises Al, the second conductive material comprises Cu and the pillarless metallic adhesion layer comprises material selected from the group consisting of Cu, Ti, Ni, Au and combination thereof.

* * * * *